ус009299728B2

(12) United States Patent
Ono

(10) Patent No.: US 9,299,728 B2
(45) Date of Patent: Mar. 29, 2016

(54) DISPLAY PANEL AND METHOD FOR PRODUCING DISPLAY PANEL

(75) Inventor: Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/357,812

(22) PCT Filed: Nov. 30, 2011

(86) PCT No.: PCT/JP2011/006727
§ 371 (c)(1),
(2), (4) Date: May 13, 2014

(87) PCT Pub. No.: WO2013/080261
PCT Pub. Date: Jun. 6, 2013

(65) Prior Publication Data
US 2014/0306229 A1    Oct. 16, 2014

(51) Int. Cl.
H01L 27/12     (2006.01)
H01L 27/15     (2006.01)
H01L 33/00     (2010.01)
H01L 33/40     (2010.01)
H01L 27/32     (2006.01)

(52) U.S. Cl.
CPC .......... H01L 27/1248 (2013.01); H01L 27/124 (2013.01); H01L 27/1262 (2013.01); H01L 27/153 (2013.01); H01L 27/3246 (2013.01); H01L 27/3248 (2013.01); H01L 27/3258 (2013.01); H01L 33/005 (2013.01); H01L 33/405 (2013.01); H01L 2933/0016 (2013.01)

(58) Field of Classification Search
None
See application file for complete search history.

(56) References Cited

U.S. PATENT DOCUMENTS

| 5,529,951 | A  | 6/1996  | Noguchi et al. |
| 5,869,803 | A  | 2/1999  | Noguchi et al. |
| 6,071,765 | A  | 6/2000  | Noguchi et al. |
| 6,172,721 | B1 | 1/2001  | Murade et al. |
| 6,249,327 | B1 | 6/2001  | Murade et al. |
| 6,480,244 | B2 | 11/2002 | Murade et al. |
| 6,982,769 | B2 | 1/2006  | Ishino |
| 7,068,246 | B2 | 6/2006  | Yamazaki et al. |
| 7,385,224 | B2 | 6/2008  | Ishii et al. |
| 7,515,125 | B2 | 4/2009  | Yamazaki et al. |

(Continued)

FOREIGN PATENT DOCUMENTS

JP   5-011281    1/1993
JP   07-235490   9/1995

(Continued)

OTHER PUBLICATIONS

Office Action issued by Japan Patent Office (JPO) in Japanese Pat. Appl. No. 2013-546843, dated Oct. 6, 2015.

(Continued)

Primary Examiner — Khaja Ahmad
(74) Attorney, Agent, or Firm — Greenblum & Bernstein, P.L.C.

(57) ABSTRACT

A display panel includes: a substrate; a bottom-gate thin-film transistor above the substrate and including a gate electrode, a first electrode, and a second electrode; an insulating layer above the thin-film transistor and including a contact hole penetrating the insulating layer in a thickness direction of the insulating layer; a pixel electrode above the insulating layer and electrically connected to the second electrode via the contact hole; and a height adjusting layer selectively located below the contact hole to allow the contact hole to have a bottom at a raised level.

18 Claims, 13 Drawing Sheets

(56) References Cited

U.S. PATENT DOCUMENTS

| | | | |
|---|---|---|---|
| 2001/0015778 A1 | 8/2001 | Murade et al. | |
| 2002/0027229 A1 | 3/2002 | Yamazaki et al. | |
| 2004/0046912 A1 | 3/2004 | Ishino | |
| 2006/0043447 A1 | 3/2006 | Ishii et al. | |
| 2006/0132401 A1 | 6/2006 | Yamazaki et al. | |
| 2006/0146267 A1* | 7/2006 | Choi | G02F 1/133377 349/156 |
| 2009/0170393 A1* | 7/2009 | Koike et al. | 445/25 |
| 2010/0012940 A1* | 1/2010 | Sato | 257/59 |
| 2010/0237348 A1* | 9/2010 | Tseng | H01L 27/124 257/59 |
| 2010/0302488 A1* | 12/2010 | Asaoka | G02F 1/1334 349/123 |
| 2011/0057920 A1* | 3/2011 | Matsuura | H01L 27/3258 345/211 |
| 2013/0229405 A1 | 9/2013 | Ono | |

FOREIGN PATENT DOCUMENTS

| | | |
|---|---|---|
| JP | 11-072802 | 3/1999 |
| JP | 11-311802 | 11/1999 |
| JP | 11-311803 | 11/1999 |
| JP | 2002-072963 | 3/2002 |
| JP | 2002-184998 | 6/2002 |
| JP | 2004-070196 | 3/2004 |
| JP | 2004-126554 | 4/2004 |
| JP | 2007-310152 | 11/2007 |
| JP | 2009-048063 | 3/2009 |
| JP | 2010-045390 | 2/2010 |

OTHER PUBLICATIONS

Search report from PCT/JP2011/006727, mail date is Jan. 17, 2012.

* cited by examiner

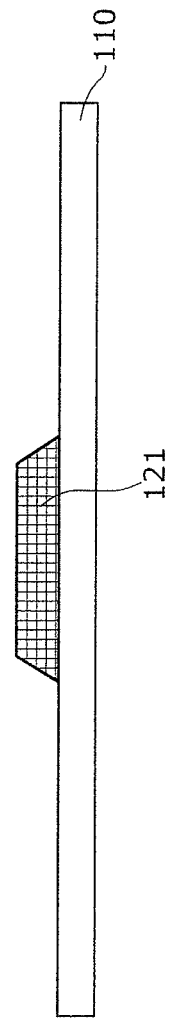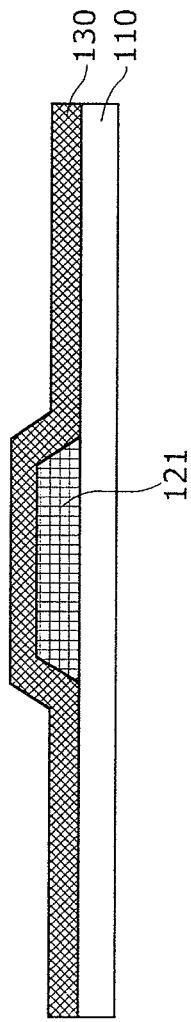

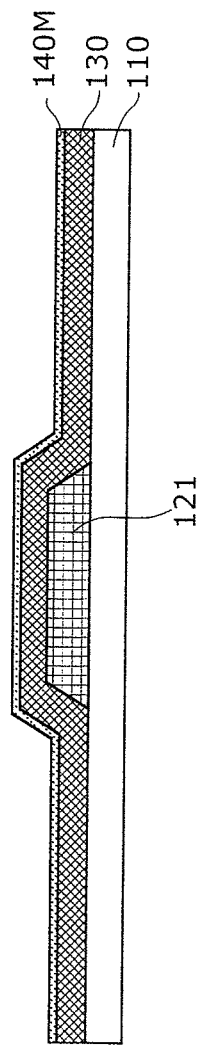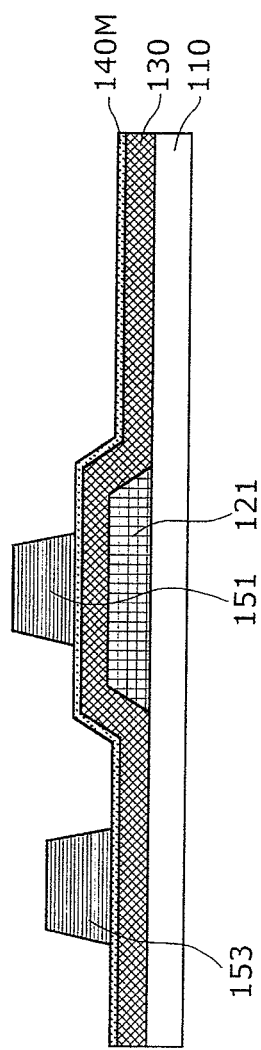

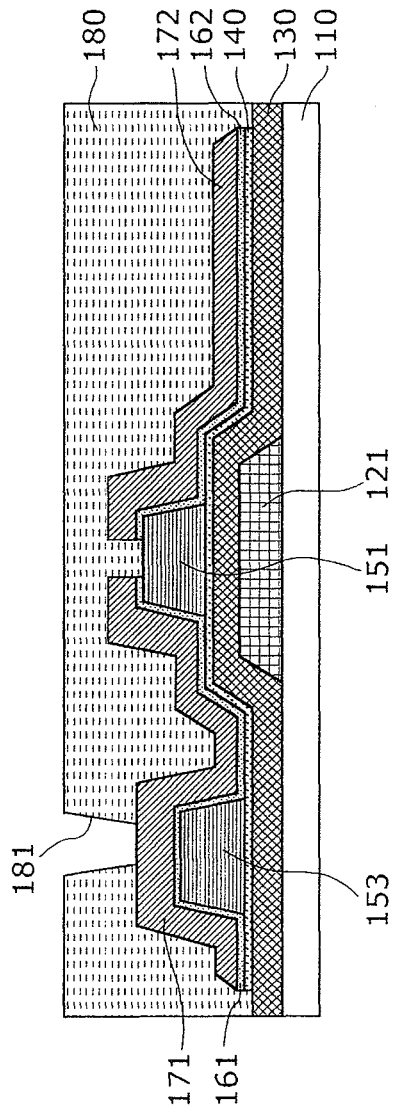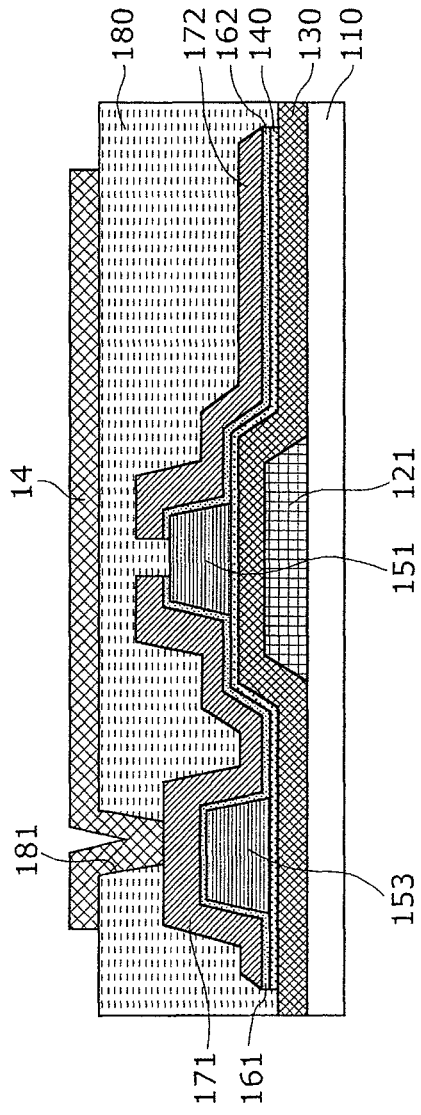

DISPLAY PANEL AND METHOD FOR
PRODUCING DISPLAY PANEL

TECHNICAL FIELD

The present invention relates to display panels and methods for producing the display panels, and particularly relates to a display panel with an increased light-emitting region and a method for producing the display panel.

BACKGROUND ART

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor (TFT) having excellent characteristics as a driving circuit for the active-matrix display device (for example, Patent Literature (PTL) 1).

CITATION LIST

Patent Literature

[PTL 1] Japanese Unexamined Patent Application Publication No. 7-235490

SUMMARY OF INVENTION

Technical Problem

A planarization layer (PL) is stacked on a thin-film transistor on a substrate. The thin-film transistor is connected to a pixel electrode in an EL layer via an opening (contact hole) of the planarization layer.

Large thickness of the planarization layer, however, increases the opening area of the contact hole in the upper surface of the planarization layer, reducing the area for the light-emitting region. As a result, current density of the EL layer increases, which disadvantageously reduces lifetime of the EL layer and increases voltage consumed by the EL layer.

The present invention has been conceived in view of such problems. An object of the present invention is to provide a display panel which has a reduced opening area of the contact hole that is for connecting the thin-film transistor and the pixel electrode, and a method for producing the display panel.

Solution to Problem

A display panel according to one embodiment of the present invention includes: a substrate; a bottom-gate thin-film transistor above the substrate, the bottom-gate thin-film transistor including a gate electrode, a first electrode, and a second electrode; an insulating layer above the bottom-gate thin-film transistor and including a contact hole penetrating the insulating layer in a thickness direction of the insulating layer; a pixel electrode above the insulating layer and electrically connected to the second electrode via the contact hole; and a height adjusting layer selectively located below the contact hole to allow the contact hole to have a bottom at a raised level.

Advantageous Effects of Invention

The present invention provides reduced length (depth) of the contact hole, which allows reduction in the opening area of the contact hole in the upper surface of an insulating layer. As a result, a large light-emitting region can be obtained.

BRIEF DESCRIPTION OF DRAWINGS

FIG. 6A illustrates a cross-section corresponding to FIG. 4 in a substrate preparation process of a method for producing a thin-film semiconductor device according to Embodiment 1.

FIG. 6B illustrates a cross-section corresponding to FIG. 4 in a gate electrode formation process of the method for producing the thin-film semiconductor device according to Embodiment 1.

FIG. 6C illustrates a cross-section corresponding to FIG. 4 in a gate insulating film formation process of the method for producing the thin-film semiconductor device according to Embodiment 1.

FIG. 6D illustrates a cross-section corresponding to FIG. 4 in a crystalline silicon thin film formation process of the method for producing the thin-film semiconductor device according to Embodiment 1.

FIG. 6E illustrates a cross-section corresponding to FIG. 4 in a channel protective layer/a height adjusting layer formation process of the method for producing the thin-film semiconductor device according to Embodiment 1.

FIG. 6H illustrates a cross-section corresponding to FIG. 4 in a planarization layer formation process of the method for producing the thin-film semiconductor device according to Embodiment 1.

FIG. 6I illustrates a cross-section corresponding to FIG. 4 in an anode formation process of the method for producing the thin-film semiconductor device according to Embodiment 1.

DESCRIPTION OF EMBODIMENTS

Figure 1:
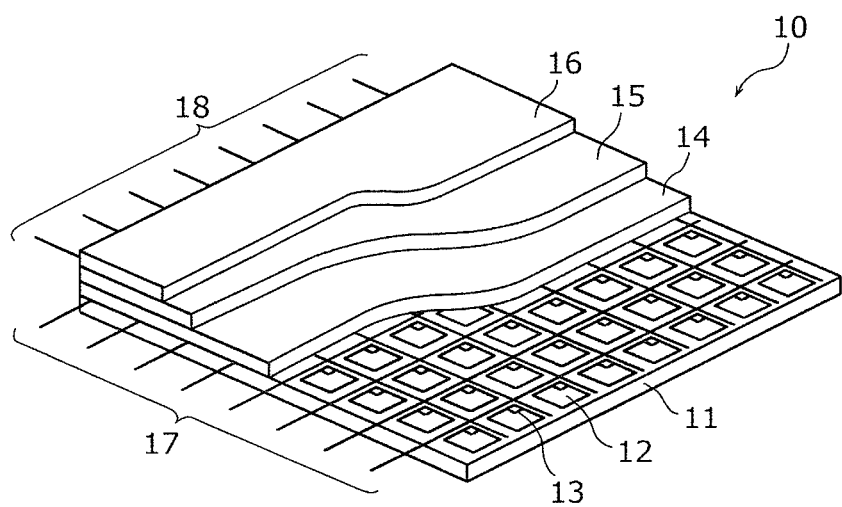
FIG. 1 is a partially cutaway perspective view of an organic EL display device according to Embodiment 1.

A display panel according to one embodiment of the present invention includes: a substrate; a bottom-gate thin-film transistor above the substrate, the bottom-gate thin-film transistor including a gate electrode, a first electrode, and a second electrode; an insulating layer above the bottom-gate thin-film transistor and including a contact hole penetrating the insulating layer in a thickness direction of the insulating layer; a pixel electrode above the insulating layer and electrically connected to the second electrode via the contact hole; and a height adjusting layer selectively located below the contact hole to allow the contact hole to have a bottom at a raised level.

According to the above structure, the length (depth) of the contact hole is small, which allows reduction in the opening area of the contact hole in the upper surface of an insulating layer. As a result, a large light-emitting region can be obtained. The term "first electrode" refers to one of the source electrode and the drain electrode, and the term "second electrode" refers to the other one of the source electrode and the drain electrode. They are determined based on the type of a thin-film transistor (P or N type) and a voltage relationship between the "first electrode" and the "second electrode".

It may also be that the pixel electrode is in direct contact with the second electrode.

It may also be that in a region from a center of a contact portion between the pixel electrode and the second electrode to a channel end portion of the bottom-gate thin-film transistor that is on a side where the second electrode is located, a minimum distance between an upper surface of the second electrode and the substrate is smaller than a distance between the contact portion and the substrate.

It may also be that a maximum thickness of the insulating layer is at least a height of the bottom-gate thin-film transistor.

It may also be that a sum of a maximum thickness and a minimum thickness of the insulating layer is at least a height of the bottom-gate thin-film transistor.

For example, it may be that the height adjusting layer comprises an insulating material.

For example, it may be that the height adjusting layer comprises a conductive material.

Furthermore, it may also be that the display panel further includes a channel etching stopper layer above a channel region of the bottom-gate thin-film transistor.

It may also be that the height adjusting layer comprises a same material as a material of the channel etching stopper layer.

It may also be that the display panel further includes a second height adjusting layer located in a same layer as the gate electrode and at a position overlapping the height adjusting layer that is in a same layer as the channel etching stopper layer.

Furthermore, it may also be that the height adjusting layer makes a distance between an upper surface of the second electrode and the substrate at a contact portion between the pixel electrode and the second electrode larger than a minimum distance between the upper surface of the second electrode and the substrate in a region from a center of the contact portion to a channel end portion of the bottom-gate thin-film transistor that is closer to the second electrode.

It may also be that the pixel electrode is a reflective electrode.

A method for producing a display panel according to one embodiment of the present invention includes: preparing a substrate; forming, above the substrate, a thin-film transistor including a gate electrode, a first electrode, and a second electrode; forming, above the thin-film transistor, an insulating layer including a contact hole penetrating the insulating layer in a thickness direction of the insulating layer; forming, above the insulating layer, a pixel electrode electrically connected to the second electrode via the contact hole; and selectively forming a height adjusting layer below the contact hole before the forming of an insulating layer, the height adjusting layer allowing the contact hole to have a bottom at a raised level.

The following shall describe a semiconductor device and a method for producing the semiconductor device according to embodiments of the present invention, with reference to the drawings. The present invention is defined by the appended claims. Therefore, among the structural elements in the following exemplary embodiments, structural elements not recited in any one of the claims are not necessarily required to achieve the object of the present invention, but are described as more preferable implementations. Note that each figure is a schematic diagram, and is not necessarily accurate.

Embodiment 1

First, referring to FIG. 1, a description is given of an organic EL display device that is an example of a display panel according to Embodiment 1. FIG. 1 is a partially cutaway perspective view of an organic EL display device according to Embodiment 1.

As FIG. 1 illustrates, an organic EL display device (display panel) 10 includes: an active matrix substrate (TFT array substrate) 11; a plurality of pixels 12 arranged in a matrix on the active matrix substrate 11; a plurality of pixel circuits 13 arranged in an array on the active matrix substrate 11 and connected to the pixels 12; an anode 14 (reflective electrode), an organic EL layer 15, and a cathode 16 (transparent electrode) that are sequentially stacked on the pixels and the pixel circuits 13; and a plurality of source lines 17 and a plurality of gate lines 18 connecting respective pixel circuits 13 to a control circuit (not illustrated). The organic EL layer 15 includes a stack of an electron transport layer, an emission layer, a hole transport layer, and so on.

Each source line 17 is arranged to correspond to a different column of the pixels 12 arranged in a matrix. More specifically, the source lines 17 are arranged in parallel to one other. Each gate line 18 is arranged to correspond to a different row of the pixels arranged in a matrix. More specifically, the gate lines 18 are arranged in parallel to one other. As a result, the source lines 17 and the gate lines 18 intersect with one another. Each pixel circuit 13 is arranged at a different cross point of the source line 17 and the gate line 18.

In Embodiment 1, a description is given of an example of the top-emission organic EL display device 10 where the anode 14 that is a lower electrode serves as a reflective electrode and the cathode 16 that is an upper electrode serves as a transparent electrode. The present invention, however, is not limited to the example, and is also applicable to the bottom-emission organic EL display device 10 where the lower electrode serves as a transparent electrode and the upper electrode serves as a reflective electrode.

Figure 2:
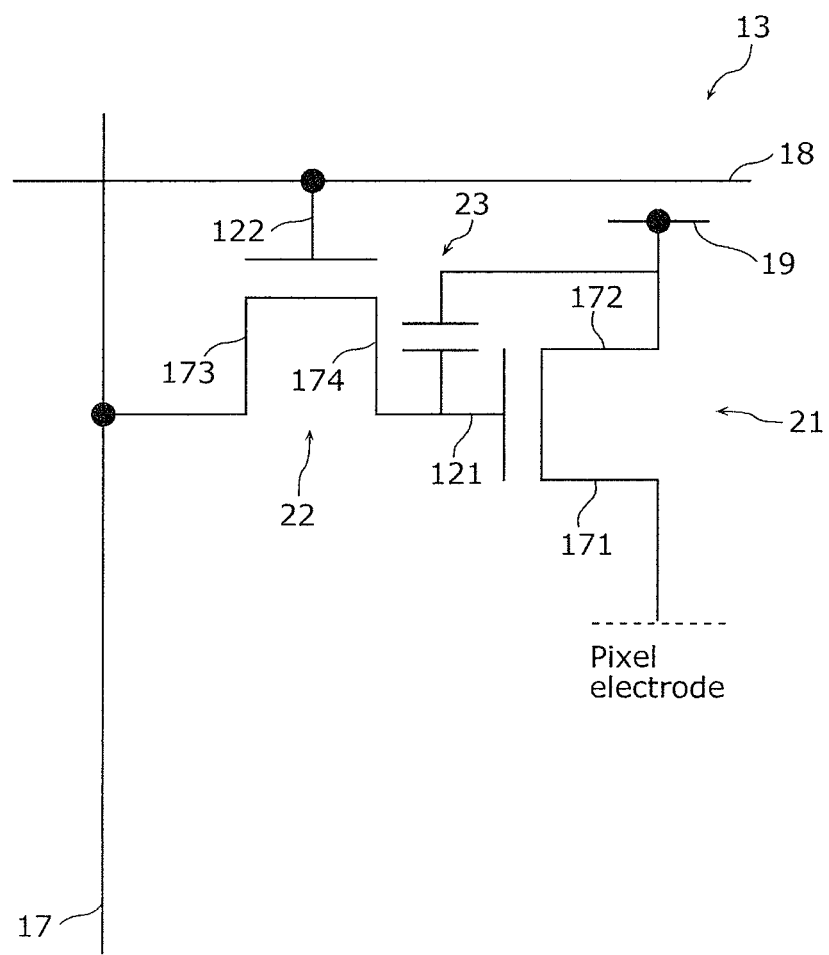
FIG. 2 illustrates a circuit configuration of a pixel circuit according to Embodiment 1.

Next, referring to FIG. 2, a description is given of a configuration of the pixel circuit 13 of the organic EL display device 10. FIG. 2 illustrates a circuit configuration of the pixel circuit 13 according to Embodiment 1. As FIG. 2 illustrates, the pixel circuit 13 includes a driving transistor 21, a switching transistor 22, and a capacitor (capacitance unit) 23. The driving transistor 21 is a transistor that drives the organic EL device. The switching transistor 22 is a transistor that selects the pixel.

The switching transistor 22 includes a source electrode 173 connected to the source line 17, a gate electrode 122 connected to the gate line 18, and a drain electrode 174 connected to the capacitor 23 and the gate electrode 121 of the driving transistor 21. The driving transistor 21 includes the drain electrode 172 connected to a power source line 19, and a source electrode 171 connected to the anode (pixel electrode) of an organic EL element.

With such a configuration, when a gate signal is input into the gate line 18 to turn on the switching transistor 22, a signal voltage supplied to the source line 17 is written into the capacitor 23 via the switching transistor 22. Subsequently, the gate signal is input to the gate line 18 again to turn off the switching transistor 22. The voltage written into the capacitor 23 is held for a period of one frame. The voltage is applied to the gate electrode of the driving transistor 21, and the conductance of the driving transistor 21 is changed according to the gate voltage, causing the driving current corresponding to luminescence gradation to flow from the anode to the cathode of the organic EL element. This causes the organic EL element to emit light, so that a predetermined image is displayed.

In Embodiment 1, a description is given of the driving transistor 21 and the switching transistor 22 serving as N-type transistors; and thus, the source electrode and the drain electrode are arranged as illustrated in FIG. 2. The positional relationship between the source electrode and the drain electrode, however, are determined based on the type of a thin-film transistor (P or N type) and a relationship of voltages applied to respective electrodes. Hence, the positional relationship described above is a mere example. In other words, in the driving transistor 21 in FIG. 2, the reference sign "171" may indicate a drain electrode, and the reference sign "172" may indicate a source electrode. In a similar manner, in the switching transistor 22 in FIG. 2, the reference sign "174" may indicate a source electrode and the reference sign "173" may indicate a drain electrode.

Figure 3:
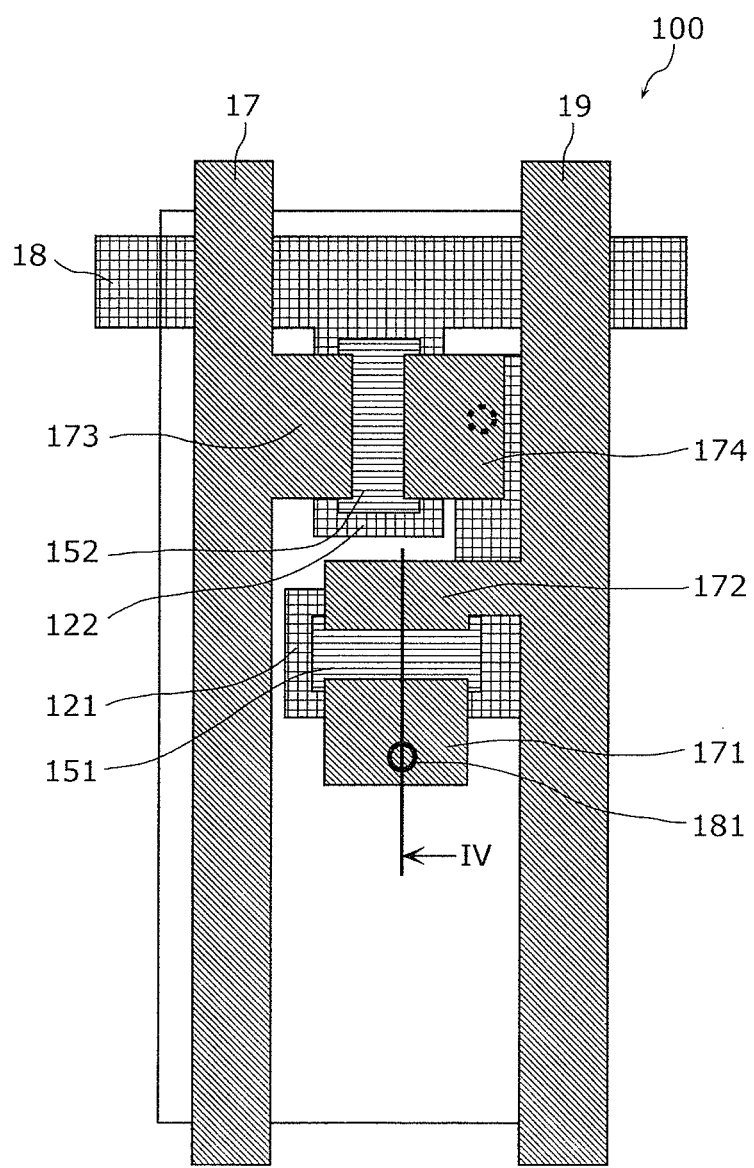
FIG. 3 is a plan view of a semiconductor device according to Embodiment 1.
Figure 4:
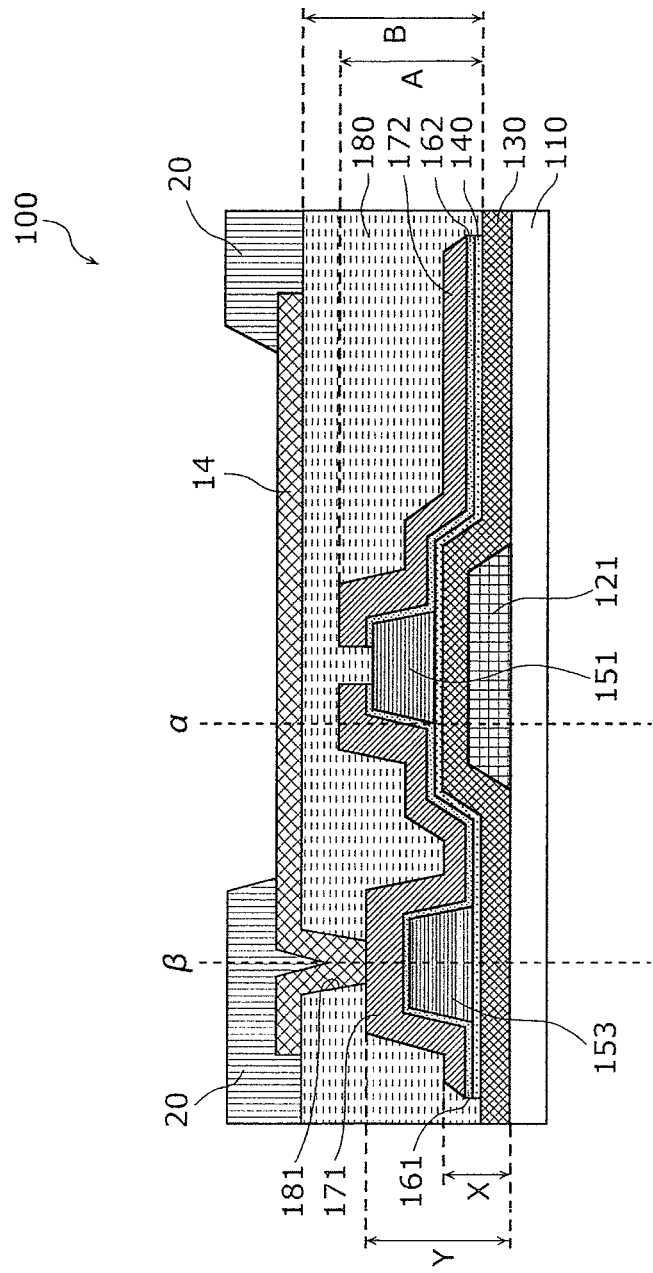
FIG. 4 illustrates a cross-section taken along line IV in FIG. 3, viewed from the direction indicated by the arrow in FIG. 3.

Next, referring to FIG. 3 and FIG. 4, a description is given of a structure of a thin-film semiconductor device 100 according to Embodiment 1. FIG. 3 is a plan view of the thin-film semiconductor device according to Embodiment 1. FIG. 4 illustrates a cross-section of the thin-film semiconductor device 100 taken along line IV in FIG. 3, viewed from the direction indicated by the arrow in FIG. 3. The thin-film semiconductor device 100 illustrated in FIG. 3 and FIG. 4 corresponds to the pixel circuit 13 in FIG. 2.

The thin-film semiconductor device 100 according to Embodiment 1 is a bottom-gate thin-film transistor which includes a substrate 110, a gate electrode 121, a gate insulating film 130, a semiconductor layer 140, a channel protective layer 151, a height adjusting layer 153, contact layers 161 and 162, a source electrode 171, and a drain electrode 172. These elements are stacked in the mentioned order. One pixel in the organic EL display device 10 illustrated in FIG. 1 corresponds to the thin-film semiconductor device 100 provided, thereon, with a stack of a planarization layer 180, the anode 14, a bank 20, the organic EL layer 15 (not illustrated in FIG. 4), and the cathode 16 (not illustrated in FIG. 4) in the mentioned order.

The substrate 110 is a glass substrate comprising, for example, a glass material such as silica glass, alkali-free glass, or highly heat-resistant glass. The substrate 110 may be a flexible substrate comprising a resin such as polyethylene terephthalate (PET), or a flexible substrate obtained by forming a resin on a metallic foil film. An undercoat layer comprising silicon nitride ($SiN_x$), silicon oxide ($SiO_y$), silicon oxynitride ($SiO_yN_x$), or others may be formed on the substrate 110 in order to prevent impurities such as sodium and phosphorus in the glass substrate from entering the channel region of the semiconductor layer 140. The undercoat layer may also function as a layer for buffering the heat on the substrate 110 when applying, to the semiconductor layer, a high-temperature thermal treatment process, such as laser annealing. The thickness of the undercoat layer can be, for example, approximately 100 nm to 2000 nm.

The gate electrode 121 is formed on the substrate 110 by patterning. The gate electrode 121 may comprise, for example, molybdenum (Mo), aluminum (Al), copper (Cu), tungsten (W), titanium (Ti), chromium (Cr), or molybdenum-tungsten (MoW). The thickness of the gate electrode 121 is, for example, approximately 100 nm to 300 nm.

The gate insulating layer 130 is formed on the entire upper surface of the substrate 110 so as to cover the gate electrode 121. The gate insulating film 130 may be, for example, a single-layer film of silicon oxide ($SiO_y$), silicon nitride ($SiN_x$), silicon oxynitride ($SiO_yN_x$), aluminum oxide ($AlO_z$), or tantalum oxide ($TaO_w$), or include a stack of the films. The thickness of the gate insulating film 130 may be, for example, approximately 100 nm to 300 nm.

The semiconductor layer 140 is formed on the gate insulating film 130 by patterning. The portion of the semiconductor layer 140 which overlaps the gate electrode 121 functions as a channel region of the thin-film transistor. The channel region of the semiconductor layer 140 is a region in which movement of carriers is controlled by the voltage applied to the gate electrode 121. The semiconductor layer 140 may comprise a metal oxide which includes, for example, one material or two or more materials from among In, Zn, Sn, Ge, Al and others.

The channel protective layer 151 is formed by patterning at a position overlapping the channel region of the semiconductor layer 140. The channel protective layer 151 functions as a channel etching stopper (CES) layer for protecting the channel region of the semiconductor layer 140. More specifically, the channel protective layer 151 has a function for preventing the channel region of the semiconductor layer 140 from being etched in etching of the source electrode 171 and the drain electrode 172.

The channel protective layer 151 may comprise organic materials mainly including silicon, oxygen, and carbon. The channel protective layer 151 according to Embodiment 1 may be formed by patterning and solidifying a light sensitive application organic material.

The organic material for forming the channel protective layer 151 includes, for example, an organic resin material, a surface acting agent, a solvent, and a photosensitizing agent. As the organic resin material, photosensitive or non-photosensitive organic resin material may be used which comprises one or more of polyimide, acrylic, polyamide, polyimide-amide, resist, benzocyclobutene, and others. As the surface activating agent, a surface activating agent comprising a silicon compound such as siloxane may be used. As the solvent, an organic solvent such as propyleneglycol monomethylether acetate or 1,4-dioxane may be used. As the photosensitizing agent, a positive photosensitizing agent such as naphthoquinone diazide may be used. Note that, the photosensitizing agent includes not only carbon but also sulfur.

When forming the channel protective layer 151, the organic material may be formed by an application method such as the spin coating. The channel protective layer 151 may be formed by a method such as the liquid drop ejection method, other than the application method. For example, an organic material may be selectively formed in a predetermined shape by using a printing method such as the screen printing or the offset printing which allow formation of the predetermined pattern.

The thickness of the channel protective layer 151 is, for example, 100 nm to 1000 nm. The minimum thickness of the channel protective layer 151 is determined in consideration of a margin for etching and aiming for suppressing the influence of the fixed charge in the channel protective layer 151. The maximum thickness of the channel protective layer 151 is determined aiming for suppressing a decrease in reliability of process caused due to an increase in level difference between the source electrode 171 and the drain electrode 172.

The height adjusting layer 153 is formed at a predetermined position on the semiconductor layer 140 by patterning. More specifically, the height adjusting layer 153 is formed at a position overlapping a contact hole 181 of the planarization layer 180 to be described later. The height adjusting layer 153 according to Embodiment 1 is formed at the same time as the formation of the channel protective layer 151 in the same layer as the channel protective layer 151 (the layer between the semiconductor 140 and the contact layers 161 and 162), with the same material as the channel protective layer 151. The thickness of the height adjusting layer 153 is generally the same as that of the channel protective layer 151, but the present invention is not limited to this example.

The height adjusting layer 153 is provided to allow the contact hole 181 to have a bottom (the contact portion between the anode 14 and the source electrode 171) at a raised level. As a result, in the region from the channel end portion of the thin-film transistor that is on a side where the source electrode 171 is located (the position indicated by the dashed line a in FIG. 4) to the center of the contact portion between the anode 14 and the source electrode 171 (the position indicated by the dashed line 13 in FIG. 4), the minimum distance X between the upper surface of the source electrode 171 and the upper surface of the substrate 110 is smaller than the distance Y between the upper surface of the source electrode 171 and the upper surface of the substrate 110 at the contact portion.

A pair of the contact layers 161 and 162 is formed by patterning so as to cover the channel protective layer 151, the height adjusting layer 153, and the semiconductor layer 140. The contact layers 161 and 162 are provided opposite to each other with a predetermined interval therebetween. More specifically, the contact layer 161 is continuously formed so as to cover a region from a portion of the upper surface of the channel protective layer 151 to one end portion of the semiconductor layer 140 (left side in FIG. 4). As a result, the contact layer 161 covers the entire upper surface of the height adjusting layer 153. The contact layer 162 is continuously formed so as to cover a region from a portion of the upper surface of the channel protective layer 151 to the other end portion of the semiconductor layer 140 (right side in FIG. 4).

The contact layers 161 and 162 are amorphous semiconductor films including a high concentration of impurities, and are n+ layers each including a high concentration of impurities of at least $1 \times 10^{19}$ [atm/cm$^3$]. More specifically, the contact layers 161 and 162 may be made of n-type semiconductor films formed by doping amorphous silicon with phosphorus (P) as impurities.

The contract layers 161 and 162 may be made of two layers; namely, a lower low-concentration field limiting layer (n− layer) and an upper high-concentration contact layer (n+ layer). The low-concentration field limiting layer is doped with phosphorus of at approximately $1 \times 10^{17}$ [atm/cm$^3$]. The two layers can be continuously formed by a chemical vapor deposition (CVD) apparatus. The contact layers 161 and 162 may be omitted when the semiconductor layer 140 comprises the metal oxide.

The source electrode 171 and the drain electrode 172 are patterned at positions overlapping the contact layers 161 and 162 respectively. More specifically, the source electrode 171 is formed so as to cover the entire upper surface of the contact layer 161. As a result, the source electrode 171 also overlaps a position of the height adjusting layer 153. The drain electrode 172 is formed so as to cover the entire upper surface of the contact layer 162.

Each of the source electrode 171 and the drain electrode 172 may have a single-layer structure or multilayer structure that comprises a conductive material, an alloy including the material, or the like. For example, the source electrode 171 and the drain electrode 172 comprise aluminum (Al), molybdenum (Mo), tungsten (W), copper (Cu), titanium (Ti), or chromium (Cr). In Embodiment 1, each of the source electrode 171 and the drain electrode 172 has a tri-layer structure of MoW/Al/MoW. The thickness of the source electrode 171 and the drain electrode 172 is, for example, approximately 100 nm to approximately 1000 nm.

The planarization layer 180 is formed so as to cover the source electrode 171 and the drain electrode 172. The planarization layer 180 is provided, at a position overlapping the source electrode 171, with the contact hole 181 penetrating the planarization layer 180 in the thickness direction of the planarization layer 180. The thickness of the planarization layer 180 is, for example, 500 nm to 5000 nm. The maximum thickness B of the planarization layer 180 illustrated in FIG. 4 is at least the height A of the thin-film transistor (the height from the upper surface of the gate insulating film 130 to the upper surfaces of the source electrode 171 and the drain electrode 172 of the thin-film transistor on the channel protective layer 151 at the portion where the driving transistor 21, the switching transistor 22, the source line 17, the gate line 18, the power source line 19, the capacitor 23 and the like are not located).

The anode 14 is independently patterned on the planarization layer 180 for each thin-film semiconductor device 100 (pixel). The anode 14 is electrically connected to the source electrode 171 via the contact hole 181. The thickness of the anode 14 may be, for example, 100 nm to 500 nm.

Although not illustrated, the bank 20 is formed on the anode 14 and the planarization layer 180 so as to partition the anode 14 for each pixel. The thickness of the bank 20 may be, for example, 100 nm to 2000 nm.

The organic EL layer 15 is formed for each pixel in an opening portion of the bank on the anode 14. The organic EL layer 15 includes a stack of a hole injection layer, a hole transport layer, an emission layer, an electron transport layer, an electron injection layer, and so on. For example, it may be that the hole injection layer comprises copper phthalocyanine, the hole transport layer comprises α-NPD (Bis[N-(1-Naphthyl)-N-Phenyl]benzidine), the emission layer comprises Alq$_3$ (tris(8-hydroxyquinoline)aluminum), the electron transport layer comprises oxazole derivative, and the electron injection layer comprises Alq$_3$. These materials are examples, and other materials may be used.

The cathode 16 is formed on the organic EL layer 15 commonly to all the pixels. Examples of a material for the cathode 16 include ITO, SnO$_2$, In$_2$O$_3$, ZnO, or a combination thereof.

Figure 5:
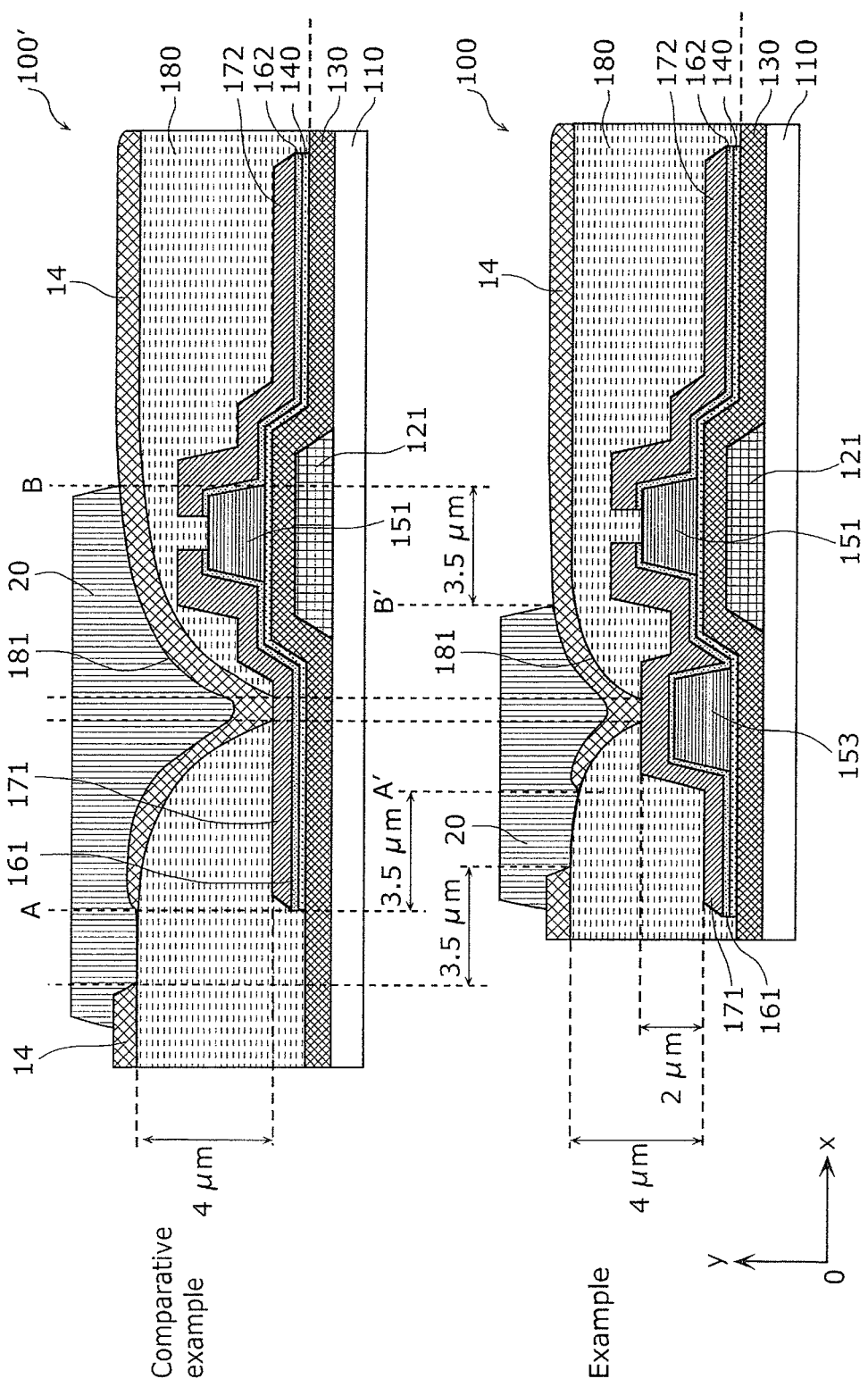
FIG. 5 illustrates comparison between a configuration according to an example and a comparative example, for illustrating the effects of the present invention.

Next, referring to FIG. 5, a description is given of effects obtained by providing the height adjusting layer 153. FIG. 5 illustrates comparison between a comparative example (top) with no height adjusting layer 153 and an example (bottom) with the height adjusting layer 153. The dimension illustrated in FIG. 5 is an example, and the present invention is not limited to the example.

In the case where no height adjusting layer 153 is provided (the comparative example), the length (depth) of the contact hole 181 is 4 μm. In contrast, in the case where the height adjusting layer 153 is provided (the example), as a result of the portion of the source electrode 171 overlapping the height adjusting layer 153 being raised by 2 μm, the length of the contact hole 181 is 2 μm that is shorter. As a result, the width of the opening (opening area) of the contact hole 181 on the upper surface of the planarization layer 180 can be reduced.

More specifically, in the case where no height adjusting layer 153 is provided, the opening width of the contact hole 181 on the upper surface of the planarization layer 180 is represented by distance |A-B| in FIG. 5. On an x-y plane where x-axis represents the cross-section direction (direction of line IV in FIG. 3) and y-axis represents the stack direction (vertical direction in FIG. 4), the distance |A-B| indicates a distance between position A and position B in the direction parallel to the x-axis. The same applies to the distance |A'-B'| that is to be described later.

Since the upper surface of the planarization layer 180 in the region between the position A and the position B is not flat, this region cannot serve as a light-emitting region so that the anode 14 and the cathode 16 on the organic EL layer 15 are not short-circuited. Hence, this region needs to be covered with the bank 20. In contrast, the opening width of the contact hole 181 on the upper surface of the planarization layer 180 when the height adjusting layer 153 is provided is represented by the distance |A'-B'| in FIG. 5. As is clear from FIG. 5, position A' and position B' recede inward by 3.5 μm respectively compared to the position A and position B.

In other words, providing the height adjusting layer 153 can reduce the width (area) of the non-flat region of the upper surface of the planarization layer 180 (region influenced by the contact hole 181). As a result, the area of the anode 14 covered with the bank 20 can be reduced, increasing the region where the organic EL layer 15 is formed. This reduces current density of the organic EL layer 15, leading to longer life of the organic EL layer 15 and higher definition of the organic EL display device 10.

In the case where no height adjusting layer 153 is provided, the upper surface of the planarization layer 180 at the position of the channel region of the thin-film transistor is not flat. In this region, the shape of the upper surface of the planarization layer 180 tends to be uneven, and the distance between the anode 14 and the channel region of the semiconductor layer 140 vary depending on the thin-film transistor. This results in variation in characteristics of the thin-film transistors. In contrast, in the case where the height adjusting layer 153 is provided, the upper surface of the planarization layer 180 at a position of the channel region of the thin-film transistor is flat. As a result, it is possible to obtain uniformity in characteristics of the thin-film transistors.

Next, referring to FIG. 6A to FIG. 6I, a description is given of a method for producing a thin-film semiconductor device according to Embodiment 1 of the present invention. FIG. 6A to FIG. 6I are cross-sectional diagrams schematically illustrating a structure in each process in the method for producing the thin-film semiconductor device according to Embodiment 1.

First, as illustrated in FIG. 6A, a substrate 110 is prepared. An undercoat layer made of a silicon nitride film, a silicon oxide film, a silicon oxynitride film or others may be formed on the substrate 110 by the plasma CVD or others, before the gate electrode 121 is formed.

Next, as illustrated in FIG. 6B, the gate electrode 121 in the predetermined shape is formed on the substrate 110. For example, a gate metal film comprising MoW is formed on the substrate 110 by sputtering. The gate electrode 121 in the predetermined shape can be formed by patterning the gate metal film using the photolithography and the wet etching. The wet etching on MoW may be performed using a chemical solution which is a mixture of phosphoric acid ($HPO_4$), nitric acid ($HNO_3$), acetic acid ($CH_3COOH$) and water in a predetermined ratio, for example.

Next, as illustrated in FIG. 6C, the gate insulating film 130 is formed on the entire upper surface of the substrate 110 so as to cover the gate electrode 121. For example, the gate insulating film 130 comprising silicon oxide is formed by the plasma CVD or others. A film of silicon oxide may be formed by introducing silane gas ($SiH_4$) and nitrous oxide gas ($N_2O$) in a predetermined ratio of concentration, for example.

Next, as illustrated in FIG. 6D, a crystalline silicon thin film 140M to be the semiconductor layer 140 is formed on the entire upper surface of the gate insulating film 130. The crystalline silicon thin film 140M can be formed, for example, as follows: first, a non-crystalline silicon thin film comprising amorphous silicon is formed by the plasma CVD or others and a dehydrogenation annealing is performed; after that, the non-crystalline silicon thin film is annealed for crystallization. The non-crystalline silicon thin film is formed by introducing silane gas ($SiH_4$) and hydrogen gas ($H_2$) in a predetermined ratio of concentration, for example.

In Embodiment 1, the amorphous silicon thin film is crystallized by the laser annealing using the excimer laser. As the method for crystallization, the laser annealing using a pulse laser with a wavelength of approximately 370 nm to approximately 900 nm, the laser annealing using the continuous wave laser with a wavelength of approximately 370 nm to approximately 900 nm, or the annealing by the rapid thermal processing (RTP) may be used. Alternatively, the crystalline silicon thin film 140M may be formed by a method such as direct growth by the CVD, instead of crystallizing the non-crystalline silicon thin film.

Subsequently, by performing hydrogen plasma treatment on the crystalline silicon thin film 140M, silicon atoms in the crystalline silicon thin film 140M are hydrotreated. The hydrogen plasma treatment is performed, for example, by generating hydrogen plasma from gas containing hydrogen gas such as $H_2$ or $H_2$/argon (Ar), using a radio frequency (RF) power, and by irradiating the crystalline silicon thin film 140M with the hydrogen plasma. With the hydrogen plasma treatment, the dangling bond (defect) of silicon atoms are hydrogen terminated. As a result, the crystal defect density of the crystalline silicon thin film 140M is decreased, improving the crystallinity.

Next, as illustrated in FIG. 6E, the channel protective layer 151 and the height adjusting layer 153 are formed by patterning on the crystalline silicon thin film 140M. In this case, first, organic materials for forming the channel protective layer 151 and the height adjusting layer 153 are applied by a predetermined application method, and an insulating film is formed so as to cover the crystalline silicon thin film 140M by the spin coating or the slit-coating. The thickness of the organic materials may be controlled by the viscosity of the organic materials and coating conditions (the number of rotations, the speed of blade, and others). As a material for the insulating film, a photosensitive application type organic material containing silicon, oxygen, and carbon may be used.

Next, the insulating film is prebaked for approximately 60 seconds at temperatures of approximately 110 degrees Celsius. With this process, the solvent in the insulating film evaporates. Subsequently, the insulating film is patterned by performing exposure and developing with use of a photomask, so that the channel protective layer 151 and the height adjusting layer 153 in predetermined shapes are formed. Next, the patterned channel protective layer 151 and height adjusting layer 153 are post-baked for approximately one hour at temperatures of 280 degrees Celsius to 300 degrees Celsius so as to solidify the channel protective layer 151 and the height adjusting layer 153. With this, part of the organic components in the channel protective layer 151 and the height adjusting layer 153 evaporate or decompose, and the channel protective layer 151 and the height adjusting layer 153 with improved film quality are formed.

Figure 6F:
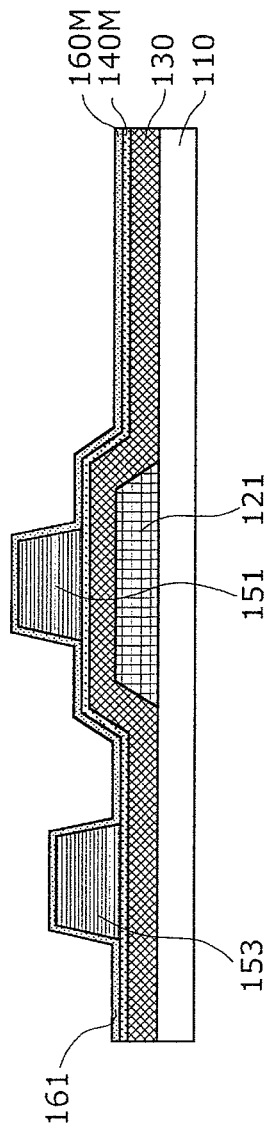
FIG. 6F illustrates a cross-section corresponding to FIG. 4 in a contact layer thin film formation process of the method for producing the thin-film semiconductor device according to Embodiment 1.

Next, as illustrated in FIG. 6F, the contact layer thin film 160M to be the contact layers 161 and 162 are formed so as to cover the channel protective layer 151 and the height adjusting layer 153. For example, the contact layer thin film 160M comprising an amorphous silicon doped with impurities of pentavalent element such as phosphorous (P) is formed by the plasma CVD.

Note that, the contract layer thin film 160M may be made of two layers; namely, a lower low-concentration field limiting layer and an upper high-concentration contact layer. The low-concentration field limiting layer may be formed by doping phosphorus at approximately $1 \times 10^{17}$ [atm/cm$^3$]. The two layers may be continuously formed by a CVD apparatus, for example.

Figure 6G:
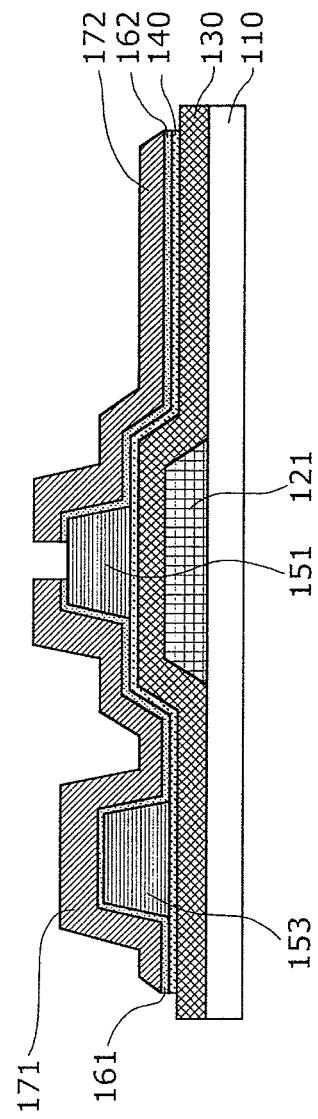
FIG. 6G illustrates a cross-section corresponding to FIG. 4 in a source electrode/a drain electrode formation process of the method for producing the thin-film semiconductor device according to Embodiment 1.

Next, the source electrode 171 and the drain electrode 172 are patterned on the contact layer thin film 160M, as illustrated in FIG. 6G. In this case, first, a source-drain metal film to be the source electrode 171 and the drain electrode 172 are formed by sputtering, for example. Subsequently, a resist patterned into a predetermined shape is formed on the source-drain metal film, and the source-drain metal film is patterned by wet etching. Here, the channel protective layer 151 serves as an etching stopper. Subsequently, the resist is removed, and the source electrode 171, and the drain electrode 172 in the predetermined shapes are formed.

Figure 8:
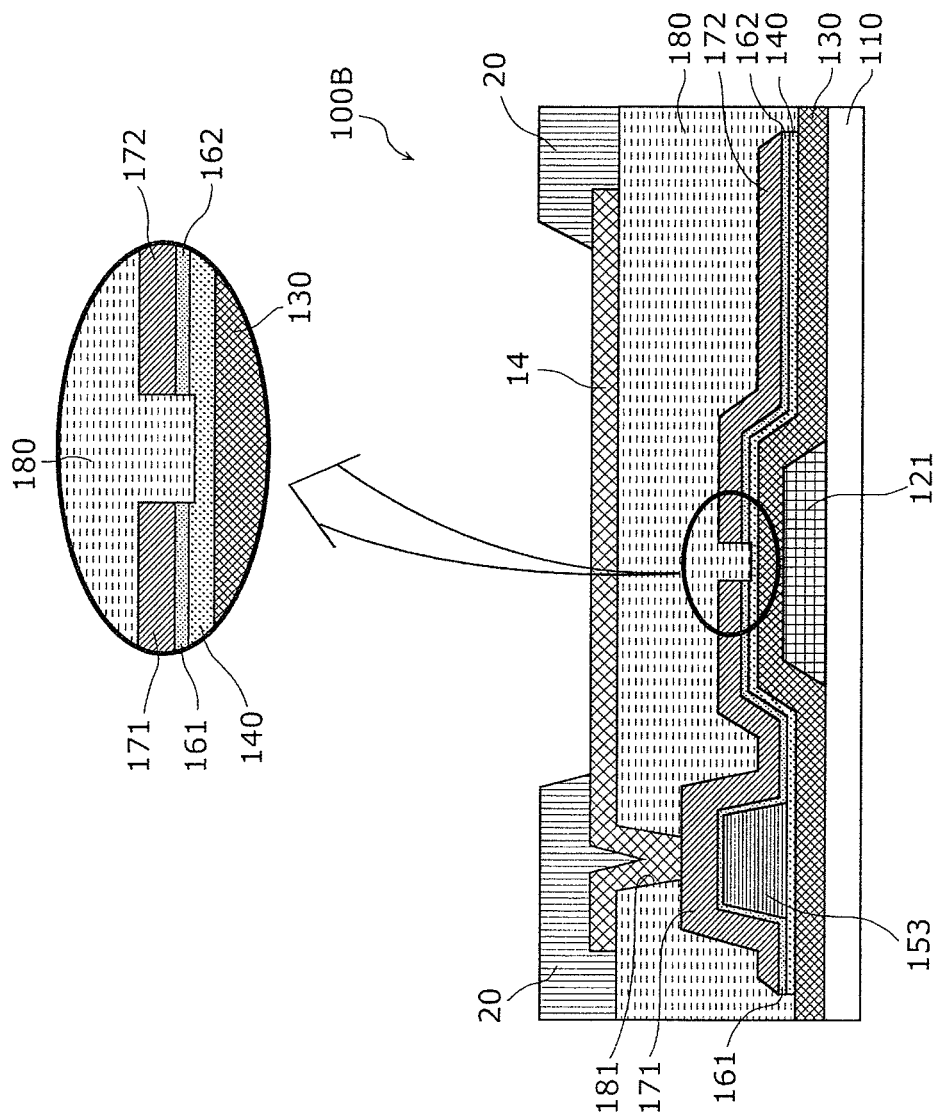
FIG. 8 illustrates a cross-section of a semiconductor device according to Variation 2 of Embodiment 1 and corresponding to FIG. 4.

Here, as illustrated in FIG. 8 to be described later, in the case where no channel protective layer 151 is provided (in the case of the channel etch type thin-film transistor), the upper surface of the semiconductor layer 140 may also be etched in the region between the source electrode 171 and the drain electrode 172. Hence, as in Embodiment 1, it may be that the channel protective layer 151 is provided at a position overlapping the channel region of the semiconductor layer 140.

Next, the semiconductor layer 140 and the pair of the contact layers 161 and 162 are formed by performing dry etching on the crystalline silicon thin film 140M and the contact layer thin film 160M using the source electrode 171 and the drain electrode 172 as a mask. Chlorine-based gas may be used for dry etching.

Next, as illustrated in FIG. 6H, the planarization layer 180 is formed so as to cover the source electrode 171 and the drain electrode 172. Subsequently, the contact hole 181 is formed which penetrates the planarization layer 180 at a position overlapping the source electrode 171, by photolithography, and etching. The contact hole 181 connects the anode 14 and the source electrode 171 at a later stage.

Next, as illustrated in FIG. 6I, the anode 14 is formed for each pixel on the planarization layer 180. Here, the contact hole 181 is filled with the material of the anode 14, so that the anode 14 and the contact hole 171 are electrically connected via the contact hole 181. The material of the anode 14 is, for example, any one of: a conductive metal such as molybdenum, aluminum, gold, silver, copper or an alloy of these; an organic conductive material such as PEDOT: PSS; zinc oxide or lead indium oxide. A film formed from any of these materials is created by vacuum deposition, electron beam evaporation, RF sputtering, or printing, and an electrode pattern is formed.

Next, although not illustrated, the bank 20, the organic EL layer 15, and the cathode 16 are sequentially formed on the planarization layer 180. More specifically, first, the bank 20 is formed so as to partition the anode 14 for each pixel on the anode 14 and the planarization layer 180. Next, the organic EL layer 15 is formed inside the opening of the bank 20 on the anode 14. The organic EL layer 15 may be formed so as to be common to all the pixels. Next, the cathode 16 which is common to all the pixels is formed on the organic EL layer 15. In such a manner, the organic EL display device 10 is formed.

Figure 7:
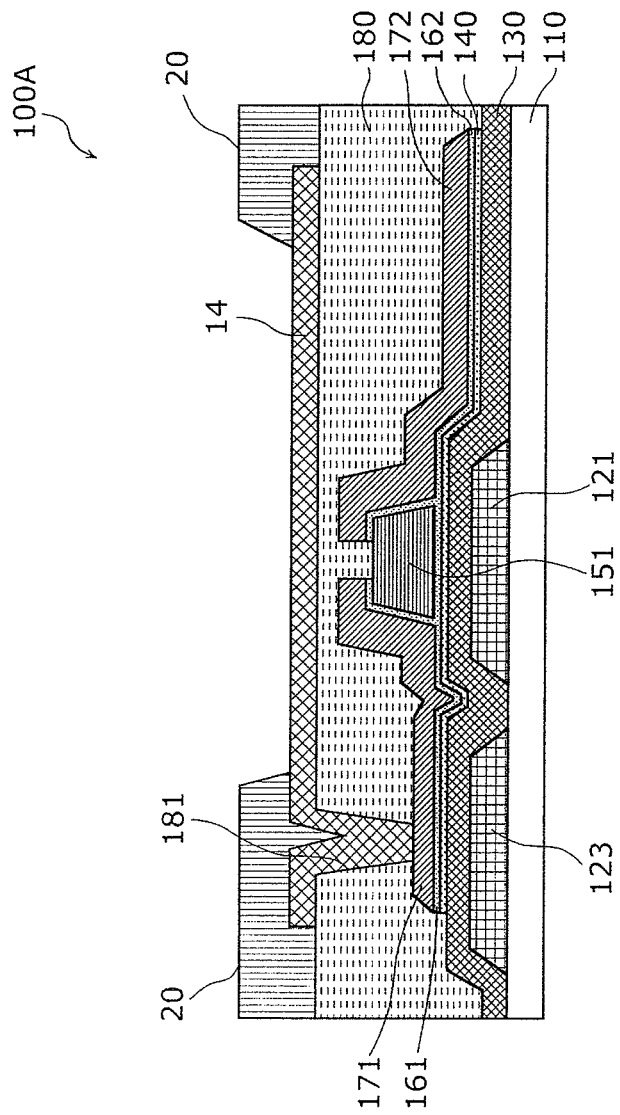
FIG. 7 illustrates a cross-section of a semiconductor device according to Variation 1 of Embodiment 1 and corresponding to FIG. 4.

Next, referring to FIG. 7 and FIG. 8, descriptions are given of Variation 1 and Variation 2 of Embodiment 1. In the subsequent description, the same reference signs are assigned to structural elements that are in common between Embodiment 1 and variations thereof, and detailed descriptions are not given to the common elements.

(Variation 1)

FIG. 7 illustrates a cross-section of a thin-film semiconductor device 100A according to Variation 1 of Embodiment 1 and corresponding to FIG. 4. The thin-film semiconductor device 100A illustrated in FIG. 7 is different from the thin-film semiconductor device 100 illustrated in FIG. 4 in that the height adjusting layer 123 is formed in the same layer as the gate electrode 121. More specifically, the height adjusting layer 123 illustrated in FIG. 7 is formed by patterning in the same layer as the gate electrode 121 (the layer between the substrate 110 and the gate insulating film 130) at the position overlapping the contact hole 181, with the same material as the gate electrode 121.

The above structure also allows the contact hole 181 to have a bottom (the contact portion between the anode 14 and the source electrode 171) at a raised level in a similar manner to Embodiment 1. In other words, the structure in FIG. 7 also provides the advantageous effects substantially the same as those in Embodiment 1. The height adjusting layer 123 illustrated in FIG. 7 may be formed by patterning at the same time as the formation of the gate electrode 121 in FIG. 6B, for example.

Furthermore, by providing the height adjusting layer 123 below the height adjusting layer 153 in FIG. 4, two height adjusting layers can be provided, increasing the advantageous effects of Embodiment 1. More specifically, the bottom of the contact hole 181 can be at a further raised level by forming the height adjusting layer 123 that is in the same layer as the gate electrode 121, and the height adjusting layer 153 that is in the same layer as the channel protective layer 151, at the positions overlapping each other (that is, the position overlapping the contact hole 181).

(Variation 2)

FIG. 8 illustrates a cross-section of a thin-film semiconductor device 100B according to Variation 2 of Embodiment 1 and corresponding to FIG. 4. The thin-film semiconductor device 100B illustrated in FIG. 8 is different from the thin-film semiconductor device 100 illustrated in FIG. 4 in that the channel protective layer 151 is not provided. More specifically, the thin-film semiconductor device 100B according to Variation 2 is a channel etch type thin-film transistor in which the upper surface of the semiconductor layer 140 is also partially etched in the region between the source electrode 171 and the drain electrode 172, as illustrated in the enlarged portion of FIG. 8.

In this case, the height adjusting layer 153 may comprise a material other than the material of the channel protective layer 151, and may comprise any insulating material. In addition, the height adjusting layer 153 according to Variation 2 may be formed in the process illustrated in FIG. 6E in a similar manner to Embodiment 1.

Embodiment 2

Figure 9:
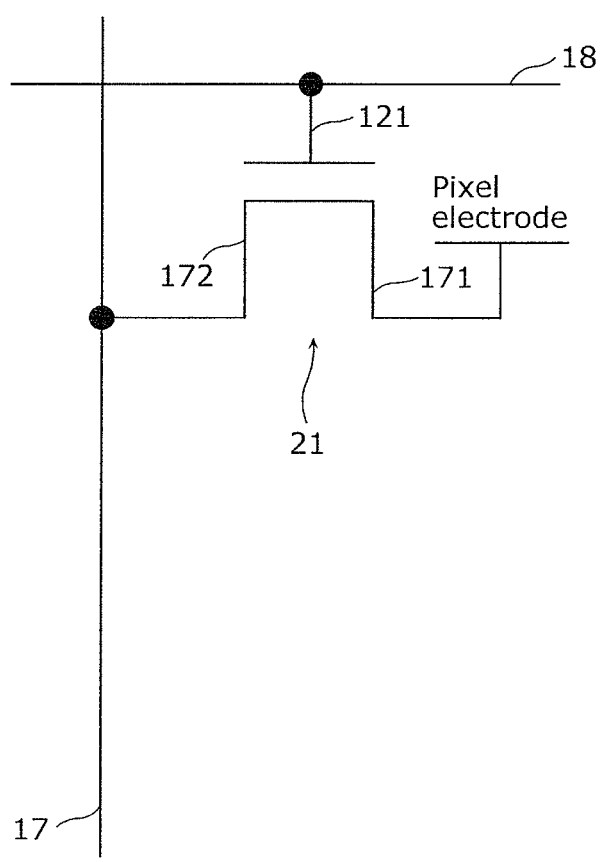
FIG. 9 illustrates a circuit configuration of a pixel circuit of a liquid crystal display device.
Figure 10:
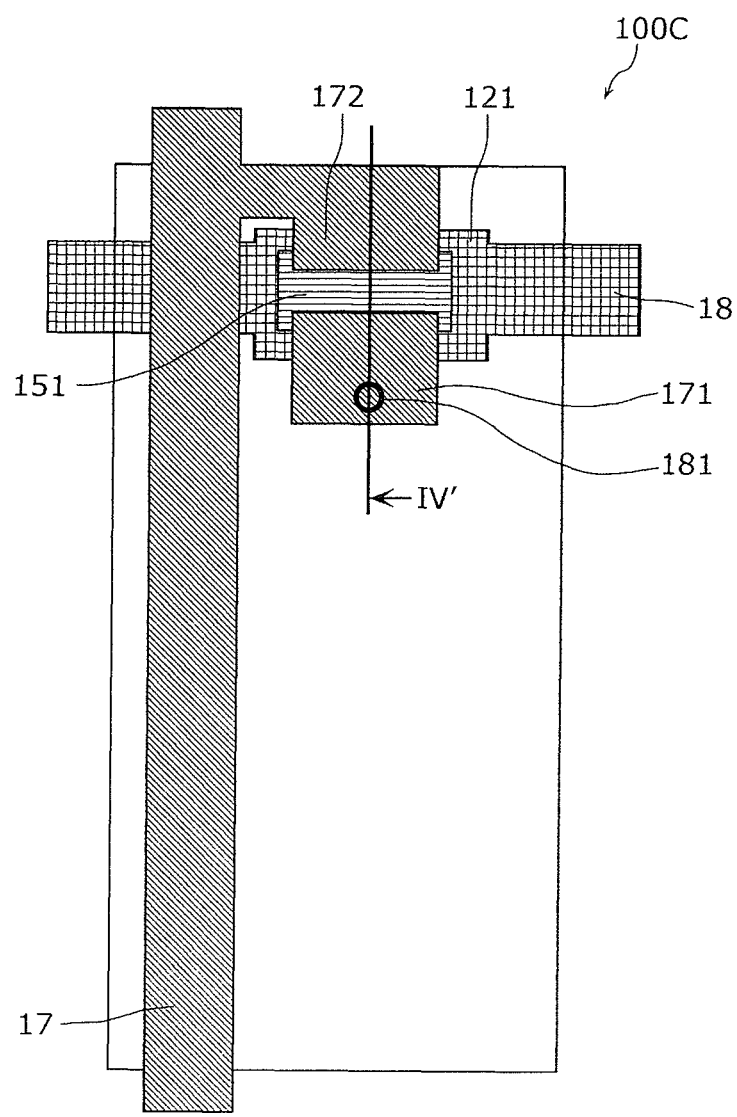
FIG. 10 is a plan view of a semiconductor device according to Embodiment 2.

Next, referring to FIG. 9 and FIG. 10, a description is given of a thin-film semiconductor device according to Embodiment 2 of the present invention. FIG. 9 illustrates a circuit configuration of a pixel circuit of a liquid crystal display device. FIG. 10 is a plan view of a thin-film semiconductor device 100C according to Embodiment 2. In the subsequent description, the same reference signs are assigned to structural elements that are in common with Embodiment 1, and detailed descriptions are not given to the common elements.

As illustrated in FIG. 9, the thin-film semiconductor device 100C includes a driving transistor 21, a gate line 18, and a source line 17. A capacitor (not illustrated) is provided between the source electrode 171 and a pixel electrode. The driving transistor 21 has a gate electrode 121 connected to the gate line 18, a drain electrode 172 connected to the source line 17, and a source electrode 171 connected to the pixel electrode. The cross-section taken along line IV' in FIG. 10, viewed from the direction indicated by the arrow in FIG. 10 is common with FIG. 4.

With such a configuration, when a gate signal is input into the gate line 18 to turn on the driving transistor 21, a signal voltage supplied via the source line 17 is written into the capacitor (not illustrated). The voltage written into the capacitor is held for a period of one frame. Images can be display by supplying the voltage to the pixel electrode to change alignment of liquid crystals.

The semiconductor device according to the present invention is applicable not only to an organic EL display device including organic EL elements, but also other display devices, such as a liquid crystal display device, which include an active matrix substrate. Furthermore, the display device with the structure as described above can be used as a flat panel display, and can be applied to electronic devices including display panels, such as a television set, a personal computer, a mobile phone.

Although the embodiments of the present invention are described with reference to the Drawings, the present invention is not limited to the illustrated embodiments. Various adjustments and modifications may be added to the illustrated embodiments within a scope that is the same as that of the present invention or within an equivalent scope.

INDUSTRIAL APPLICABILITY

The present invention is advantageously used as a thin-film semiconductor device used in a pixel circuit in a display device.

REFERENCE SIGNS LIST

10 Organic EL display device
11 Active matrix substrate
12 Pixel
13 Pixel Circuit
14 Anode
15 Organic EL layer
16 Anode
17 Source line
18 Gate line
19 Power source line
20 Bank
21 Driving transistor
22 Switching transistor
23 Capacitor
100, 100A, 100B, 100C Thin-film semiconductor device
110 Substrate
121, 122 Gate electrode
123, 153 Height adjusting layer
130 Gate insulating film
140 Semiconductor layer
140M Crystalline silicon thin film
151, 152 Channel protective layer
160M Contact layer thin film
161, 162 Contact layer
171, 173 Source electrode
172, 174 Drain electrode
180 Planarization layer
181 Contact hole

The invention claimed is:

1. A display panel, comprising:
a substrate;
a bottom-gate thin-film transistor above the substrate, the bottom-gate thin-film transistor including a gate electrode, a first electrode, and a second electrode;
a channel protective layer above the gate electrode;
an insulating layer above the bottom-gate thin-film transistor and including a contact hole penetrating the insulating layer in a thickness direction of the insulating layer;
a pixel electrode above the insulating layer and electrically connected to the second electrode via the contact hole;
a bank above the contact hole and defining an organic electroluminescence layer; and
a height adjusting layer selectively located below the contact hole to allow the contact hole to have a bottom at a raised level,
wherein the height adjusting layer and the channel protective layer are formed on a same layer and comprise a same material, and
the second electrode entirely covers a top surface and at least two side surfaces of the height adjusting layer.

2. The display panel according to claim 1,
wherein the pixel electrode is in direct contact with the second electrode.

3. The display panel according to claim 1,
wherein, in a region from a center of a contact portion between the pixel electrode and the second electrode to a channel end portion of the bottom-gate thin-film transistor that is on a side where the second electrode is located, a minimum distance between an upper surface of the second electrode and the substrate is smaller than a distance between the contact portion and the substrate.

4. The display panel according to claim 1,
wherein a maximum thickness of the insulating layer is at least a height of the bottom-gate thin-film transistor.

5. The display panel according to claim 1,
wherein a sum of a maximum thickness and a minimum thickness of the insulating layer is at least a height of the bottom-gate thin-film transistor.

6. The display panel according to claim 1,
wherein the height adjusting layer comprises an insulating material.

7. The display panel according to claim 1,
wherein the height adjusting layer comprises a conductive material.

8. The display panel according to claim 1, further comprising
a channel etching stopper layer above a channel region of the bottom-gate thin-film transistor.

9. The display panel according to claim 8,
wherein the height adjusting layer comprises a same material as a material of the channel etching stopper layer.

10. The display panel according to claim 1,
wherein a distance between an upper surface of the second electrode and the substrate at a contact portion between the pixel electrode and the second electrode is larger than a minimum distance between the upper surface of the second electrode and the substrate in a region from a center of the contact portion to a channel end portion of the bottom-gate thin-film transistor that is closer to the second electrode.

11. The display panel according to claim 1, wherein the pixel electrode is a reflective electrode.

12. A method for producing a display panel, comprising:
preparing a substrate;
forming, above the substrate, a thin-film transistor including a gate electrode, a first electrode, and a second electrode;
forming, above the gate electrode, a channel protective layer;
forming, above the thin-film transistor, an insulating layer including a contact hole penetrating the insulating layer in a thickness direction of the insulating layer;
forming, above the insulating layer, a pixel electrode electrically connected to the second electrode via the contact hole;
forming, above the pixel electrode and the contact hole, a bank that defines an organic electroluminescence layer; and
selectively forming a height adjusting layer below the contact hole before the forming of an insulating layer, the height adjusting layer allowing the contact hole to have a bottom at a raised level,
wherein the height adjusting layer and the channel protective layer are formed on a same layer and comprise a same material, and
the second electrode entirely covers a top surface and at least two side surfaces of the height adjusting layer.

13. The display panel according to claim 1, wherein the bank is directly on the pixel electrode.

14. A display panel, comprising:
a substrate;
a bottom-gate thin-film transistor above the substrate, the bottom-gate thin-film transistor including a gate electrode, a first electrode, and a second electrode;
an insulating layer above the bottom-gate thin-film transistor and including a contact hole penetrating the insulating layer in a thickness direction of the insulating layer;
a pixel electrode above the insulating layer and electrically connected to the second electrode via the contact hole;
a bank above the contact hole and defining a light-emitting region;
a height adjusting layer selectively located below the contact hole to allow the contact hole to have a bottom at a raised level; and
a channel protective layer above the gate electrode,
wherein the height adjusting layer and the channel protective layer are formed on a same layer and comprise a same material, and
the second electrode entirely covers a top surface and at least two side surfaces of the height adjusting layer.

15. The display panel according to claim 1, wherein the height adjusting layer and the channel protective layer have a same thickness.

16. The display panel according to claim 1, wherein a center of the height adjusting layer is aligned with a center of the contact hole in a width direction of the display panel.

17. The display panel according to claim 1, wherein the height adjusting layer comprises a conductive material.

18. A method for producing a display panel, comprising:
preparing a substrate;
forming, above the substrate, a thin-film transistor including a gate electrode, a first electrode, and a second electrode;
forming, above the thin-film transistor, an insulating layer including a contact hole penetrating the insulating layer in a thickness direction of the insulating layer;
forming, above the insulating layer, a pixel electrode electrically connected to the second electrode via the contact hole;
forming, above the pixel electrode and the contact hole, a bank that defines a light-emitting region; and
selectively forming a channel protective layer and a height adjusting layer, the channel protective layer being formed above the gate electrode, the height adjusting layer being formed below the contact hole before the forming of an insulating layer, the height adjusting layer allowing the contact hole to have a bottom at a raised level,
wherein the channel protective layer and the height adjusting layer are formed on a same layer at a same time, and
the second electrode entirely covers a top surface and at least two side surfaces of the height adjusting layer.

* * * * *